United States Patent
Krassnitzer et al.

(10) Patent No.: US 9,536,714 B2
(45) Date of Patent: Jan. 3, 2017

(54) SPUTTERING TARGET HAVING INCREASED POWER COMPATIBILITY

(71) Applicant: Oerlikon Surface Solutions AG, Trübbach, Trübbach (CH)

(72) Inventors: Siegfried Krassnitzer, Feldkirch (AT); Juerg Hagmann, Sax (CH); Joerg Kerschbaumer, Feldkirch (AT)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 0 days.

(21) Appl. No.: 14/783,168

(22) PCT Filed: Apr. 7, 2014

(86) PCT No.: PCT/EP2014/000927
§ 371 (c)(1),
(2) Date: Oct. 8, 2015

(87) PCT Pub. No.: WO2014/166620
PCT Pub. Date: Oct. 16, 2014

(65) Prior Publication Data
US 2016/0064201 A1 Mar. 3, 2016

Related U.S. Application Data

(60) Provisional application No. 61/809,524, filed on Apr. 8, 2013.

(51) Int. Cl.
*C23C 14/34* (2006.01)
*H01J 37/34* (2006.01)

(52) U.S. Cl.
CPC ....... *H01J 37/3435* (2013.01); *C23C 14/3407* (2013.01); *H01J 37/3438* (2013.01); *H01J 37/3467* (2013.01); *H01J 37/3497* (2013.01)

(58) Field of Classification Search
CPC ............... C23C 14/3407; H01J 37/3435; H01J 37/3438; H01J 37/3467; H01J 37/3497
(Continued)

(56) References Cited

U.S. PATENT DOCUMENTS 5,071,535 A * 12/1991 Hartig ................. C23C 14/3407
204/298.09
5,232,572 A * 8/1993 Schuhmacher ..... C23C 14/3407
204/298.09
(Continued)

FOREIGN PATENT DOCUMENTS

DE 19535894 A1 4/1997
EP 0393344 A1 10/1990
(Continued)

OTHER PUBLICATIONS

Machine Translation JP 2003-226967 Dated Aug. 2003.*
(Continued)

*Primary Examiner* — Rodney McDonald (57) ABSTRACT

A plate-centering system that has a plate with a holder, in which the plate is centered in the holder both at room temperature and at higher temperatures, independently of the thermal expansion of the plate and the holder, and the plate can freely expand in the holder at higher temperatures. The invention relates in particular to a target having a frame-shaped target mount, which is very well suited for use in a coating source for high power pulsed magnetron sputtering of the target.

6 Claims, 4 Drawing Sheets

(58) Field of Classification Search
USPC .......................... 204/298.09, 298.12, 298.13
See application file for complete search history.

(56) References Cited

U.S. PATENT DOCUMENTS

| | | | |
|---|---|---|---|
| 5,269,894 A * | 12/1993 | Kerschbaumer .... | C23C 14/3407 204/192.12 |
| 5,876,573 A * | 3/1999 | Moslehi .............. | C23C 14/3407 204/192.12 |
| 6,039,855 A | 3/2000 | Wollenberg | |

FOREIGN PATENT DOCUMENTS

| | | |
|---|---|---|
| EP | 0512456 A1 | 11/1992 |
| EP | 1106715 A1 | 6/2001 |
| JP | 2003226967 A | 8/2003 |
| JP | 2010116605 A | 5/2010 |
| WO | 2013149692 A1 | 10/2013 |

OTHER PUBLICATIONS

Kaneka Corporation: "Graphinity," 2010; URL: http://www.elecdiv.kaneka.co.jp/english/graphite/index.html (retrieved on Aug. 14, 2014).

"Hochwärmeleitende Karbonfolien Serie KU-CB1200," Internet Citation, Nov. 30, 2010; URL: http://www.heatmanagement.com/local/media/hmproducts/ku-cbl200-50/ku-cb1200_datenblatt.pdf (retrieved on May 16, 2013).

* cited by examiner

SPUTTERING TARGET HAVING INCREASED POWER COMPATIBILITY

FIELD OF THE INVENTION

The present invention relates to a plate-centering system that has a plate with a holder, in which the plate is centered in the holder both at room temperature and at higher temperatures, independently of the thermal expansion of the plate and the holder, and the plate can freely expand in the holder at higher temperatures. In particular, the present invention relates to a target having a frame-shaped target mount, which is very well suited for use in a coating source for high power pulsed magnetron sputtering of the target

BACKGROUND OF THE INVENTION

High power densities are required in order to operate sputtering processes in an economical way. The cooling of the sputtering target, however, is extremely crucial in this regard, These days, sputtering targets are usually either directly or indirectly cooled.

Figure 2:
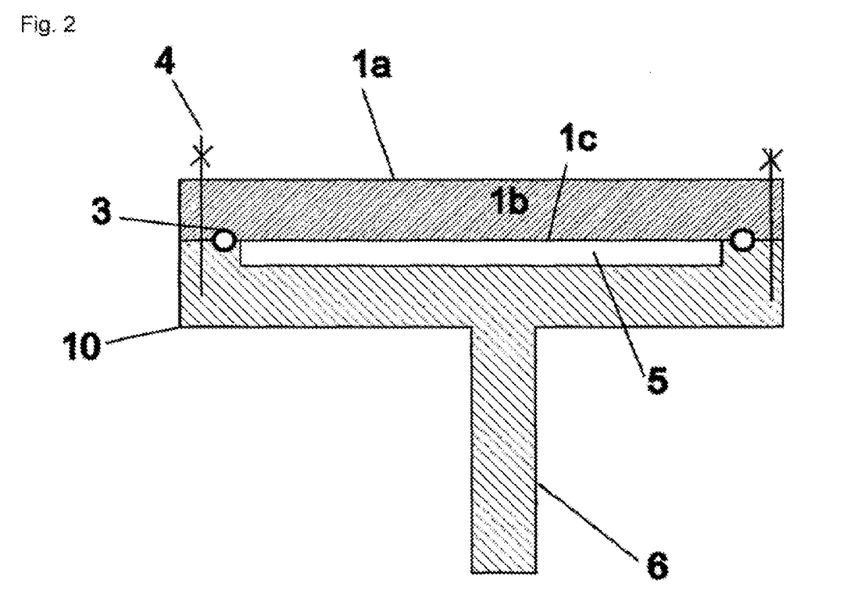
FIG. 2 illustrates a schematic view of a directly cooled sputtering target.

A directly cooled target is schematically depicted by way of example in FIG. 2: The power relayed to the target surface 1a for the sputtering is conveyed to the back 1c of the target as a function of the thermal conductivity of the target material 1b. A cooling liquid (usually water) flows through the cooling liquid conduit 5 (usually a water conduit) in a sputtering source base body 10 and dissipates the flow of heat in accordance with the flow conditions, in order to firmly affix the target 1 to the water conduit 5, usually screws 4 are used, which extend through the target 1 and the sputtering source base body 10. It is also necessary to provide a seal 3 in order to prevent water from flowing into the vacuum chamber. Other components of a sputtering target cooling device of this type that are known to the person skilled hi the art are not shown in FIG. 2.

Figure 3:
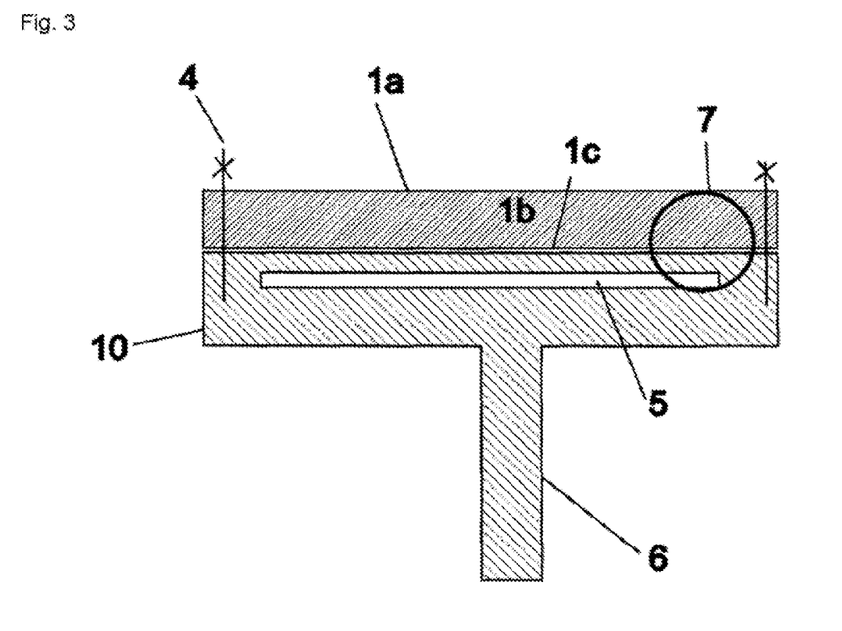
FIG. 3 illustrates a schematic view of an indirectly cooled sputtering target.

An indirectly cooled target is shown by way of example in FIG. 3. In this case, the cooling liquid conduit 5 is closed, producing a so-called closed cooling plate. The target 1 is fastened (e.g. screwed or clamped) to the closed cooling plate so that the back 1c of the target 1 is brought into contact with the cooling surface and the pressing of the back 1c of the target against the cooling surface enables and promotes a thermal transfer from the target to the cooling liquid. Other components of a sputtering target cooling plate device of this kind that ate known to the person skilled in the art are .not shown in FIG. 2.

Depending on the cooling .method or extreme power densities, a high temperature of the target can occur and can cause the mechanical strength of the target material to fail.

An example is the case of a target made of aluminum, which is affixed to a cooling plate as shown in FIG. 3 with screws at the edge of the cooling plate and is pressed against the solid cooling surface. When heating occurs due to the sputtering operation in. a sputtering target cooling plate device, as shown in FIG. 3, the. target may expand until tensions and mechanical distortions occur due to the clamping by means of the screws, which have a negative impact on the thermal conduction to the cooling plate, which can result in. the destruction of the target. Taking into account these boundary conditions, the power density in a sputtering target, for example made of aluminum, must be limited to the values below 10 W/cm$^2$ and if possible, below 5 W/cm$^2$.

Figure 4:
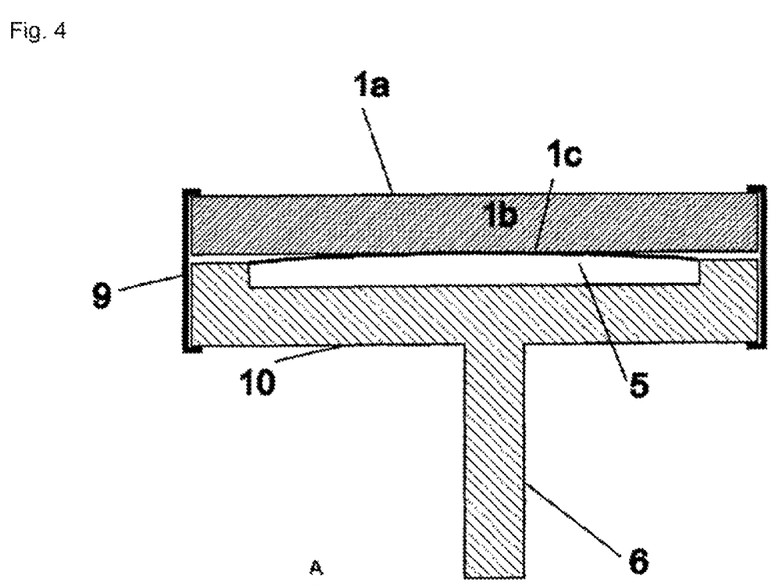
FIG. 4 illustrates a schematic view of indirect cooling by means of a movable diaphragm.

Another important method of target clamping and cooling is indirect cooling by means of a movable diaphragm, as shown in Fig, 4, The target is affixed to the sputtering source base body 10 by suitable means 9 (e.g. by clamps, screws, or bayonet fittings). In the cooling conduit 5, through which a cooling liquid (as a rule water) flows, a hydrostatic pressure prevails that presses the movable diaphragm uniformly against the back 1c of the target. A movable diaphragm of this kind can, for example, be embodied as a kind of metal foil. For this reason, cooling plate devices of this kind, that are equipped with movable diaphragms are also referred to as foil cooling plate devices or simply foil cooling plates.

Between the diaphragm and the back of the target, a reduced thermal, conduction area is to be expected. This conduction area, can be improved, significantly by inserting a ductile insert foil, for example made of indium, tin, or graphite. For example, an extremely thin self-adhesive carbon film can be glued to the back of the target or to the side of the diaphragm that should be in contact with the back of the target, as described in WO2013149692 A1, in order to optimally improve the thermal conduction.

A disadvantage of this method, however, is the fact that the hydrostatic pressure subjects the target to a bending stress. At extremely high power densities and elevated temperatures, the mechanical strength of the target is often insufficient to prevent a bending and therefore destruction of the target. In particular, it is not sufficient if bayonet fittings are used as an abutment for the clamping and fixing of the target to the sputtering source body. For example, targets made of aluminum and titanium or of aluminum and chromium, which are as a rule produced using powder metallurgy, become very soft and ductile at temperatures above 200° C. As a result, at temperatures above 200° C., such targets often buckle and are destroyed.

The object of the present invention is to create a sputtering source device that makes it possible to use a cooling plate device with a movable diaphragm in which at high temperatures, the target is not destroyed by the action of the hydrostatic pressure in the cooling conduit of the cooling plate device.

DETAILED DESCRIPTION OF THE PREFERRED EMBODIMENTS

The object of the present invention is attained by creating a coating source with a plate-centering system.

Figure 1A:
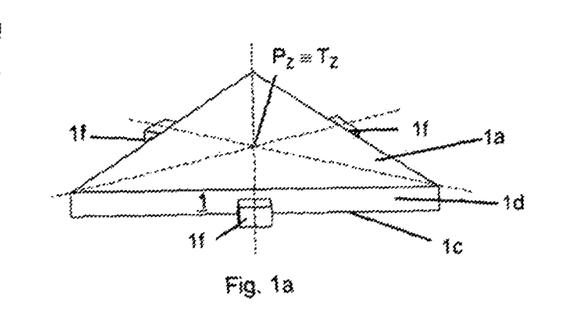
FIG. 1 shows a place-centering system in accordance with the invention.
Figure 1B:
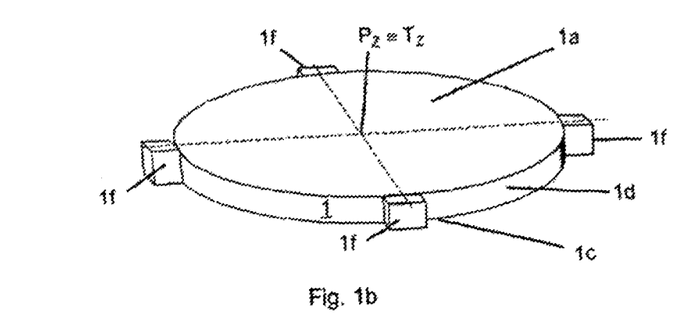
Figure 1C:
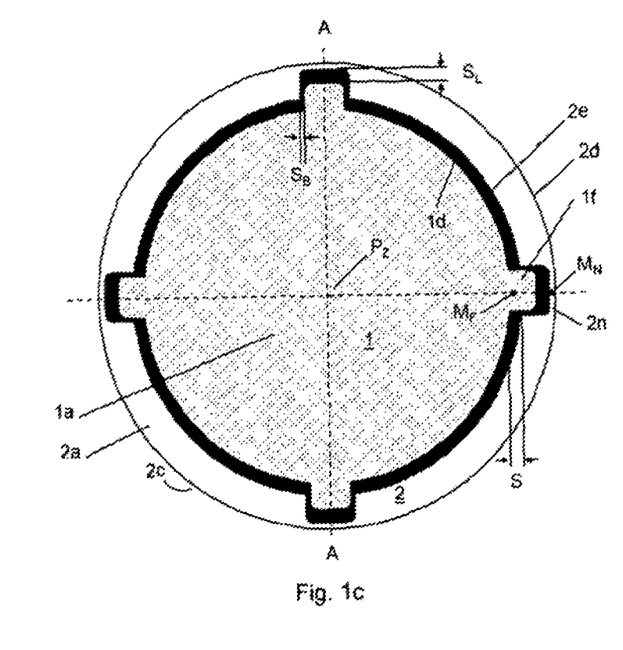

The plate-centering system according to the present invention has a plate with a holder, as schematically depicted in FIG. I, in which the plate 1 has a front 1a, a back 1c, and an outer edge surface 1d that extends from the front of the back and is composed of a first material 1b with a first thermal expansion coefficient α1, the holder has a frame-shaped plate mount 2 with an inside 2e for accommodating the plate and is composed of a second material with a second thermal expansion coefficient α2, characterized in that:

at room temperature, the circumference of the inside 2e of the plate mount is greater than the circumference of the edge surface 1d of the plate 1, as a result of which when the plate 1 is in a centered position in the plate mount 2, there is a gap with the defined gap width S between the edge surface of the plate and the inside of the plate mount and the edge surface, preferably the edge surface 1d closer to the bottom 1c, has one or more guide protrusions 1f, which extend outward beyond the edge surface 1d, preferably in a plane that is essentially parallel to the back surface 1d of the plate 1, and engage in corresponding grooves 2n of the inside 2e of the plate mount 2 and/or the edge surface 1d has one or more grooves 1n which extend inward beyond the edge surface 1d, preferably in a plane that is essentially parallel to the back, surface of the plate, and corresponding guide protrusions 2f on the inside 2e of the plate mount 2 engage in these grooves the plate-centering system has at least three such "guide protrusion/groove" pairs that engage with one another and for each "guide protrusion/groove" pair, the width profiles in the direction tangential to the edge surface of the plate and the length profiles in the direction perpendicular to the edge surface of the plate are matched to each other so that at room temperature, the play $S_B$ in the tangential direction is less than the play $S_L$ in the perpendicular direction and at the same time $S_L \geq S$ and the "guide protrusion/groove" pairs are distributed so that the position $M_N$ of the middle of the width of a groove coincides with the position $M_Y$ of the middle of the width of the corresponding guide protrusion in each of the "guide protrusion/groove" pairs and this position is selected so that at room temperature, it is situated in an axial direction from the plate center $P_Z$, which position, after a thermal expansion of the plate 1 or of the plate 1 and plate mount 2 at higher temperatures, remains unchanged in the same axial direction from the plate center $P_Z$, and both at room temperature and at higher temperatures, at which the plate 1 or the plate 1 and plate mount 2 expand, the plate 1 in the plate mount 2 remains anchored so that it is always centered in the plate mount except for at most the play $S_B$.

In a plate-centering system according to the present invention, the linear thermal expansion coefficient of the plate material is preferably greater than, the linear thermal expansion coefficient of the holder material or is at least equal to it, i.e. α1≥α2, preferably α1>α2.

A particularly preferred embodiment of the present invention relates to a "plate-holding" system, which has a disc-shaped plate with a holder, in which the plate has a circular surface extending across wide regions of its circumference and has an outer plate edge, and the material of the plate has a first thermal expansion coefficient α1 and the holder has a circular opening extending across wide regions of its circumference, which is delimited by an inner holder edge, and the material of the holder has a second thermal expansion coefficient α2, characterized in that:

at room temperature, the circumference of the opening of the holder is greater than the circumference of the surface of the plate, as a result of which with a centered position of the plate in the opening of the holder, there is a gap with a defined, gap width S between the plate edge and the inner holder edge and α2<α1 and the plate edge has one or more protrusions, which, viewed from the center point of the circular surface, extend for protrusion lengths from the plate edge surface in the radial direction and engage in corresponding recesses with recess lengths of the holder edge and/or the plate edge has one or more recesses, which, viewed from the plate edge, extend for recess lengths toward the center point of the circular surface and are engaged by corresponding protrusions with protrusion lengths on the holder edge in which the "plate-holding" system has at least three such recess/protrusion pairs and for the recess/protrusion pairs, the lengths are selected so that at room temperature, except for a radial spacing of at most d, the recesses are each engaged in the radial direction by the protrusion, whose size corresponds to that of the gap width S and for the recess/protrusion pairs in the tangential direction, the width profiles are matched to each other so that the recess can function as a guide rail for the corresponding protrusion, whose play sp=$S_B$) in the tangential direction is less than S, and as a result, both at room temperature and at higher temperatures, at which the plate expands more than the holder, the expanding plate is anchored so that it is always centered in the holder except for at most the play sp.

The expansion coefficient or heat expansion coefficient is a value that describes the behavior of a material with regard to changes in its dimensions when temperature changes occur and is therefore also often, referred to as the thermal expansion, coefficient. Thermal expansion is the effect that is responsible for this. The thermal expansion depends on the material used; it is therefore a material-specific material constant. Since the thermal expansion in many materials does not occur uniformly across all temperature ranges, the thermal expansion coefficient itself is temperature-dependent and is therefore indicated for a particular reference temperature or a particular temperature range.

A distinction is drawn between the longitudinal thermal expansion coefficient α (also known as the linear thermal expansion coefficient) and the spatial thermal expansion coefficient γ (also known as the spatial expansion coefficient, the volumetric expansion coefficient, or the cubic expansion coefficient).

The longitudinal expansion coefficient α is the proportionality constant between the temperature change dT and the relative length change dL/L of a solid, it is therefore used to describe the relative length change that occurs with a temperature change. It is a material-specific value whose unit of measure is $K^{-1}$ (per Kelvin) and is defined by the. following equation: α=1/L·dL/dT; in simplified form, the equation, would be $L_{final} \approx L_{initial} \cdot (1+\alpha \cdot \Delta T)$.

It would then be possible, for example, to calculate what length the plate would have in a particular direction of the plate surface at a maximum operating temperature, hi a similar way, the dimensions could be calculated according to the thermal expansion of the holder. It is thus possible to calculate the gap widths between the plate and the holder that are necessary to ensure the free thermal expansion of the plate in the holder up to the maximum, operating temperature.

It can be assumed, for example, that $L_{1final} \approx \alpha_1 \cdot L_{1initial} \cdot \Delta T_1$, where $L_{1final}$ is the length of the plate in a particular direction (i.e. the diameter in the case of a disc-shaped plate) at a temperature $T_{final}$ (for example at the maximum operating temperature of the plate), $\alpha_1$ is the linear thermal expansion coefficient of the plate in the operating temperature range, $L_{initial}$ is the length of the plate in the same direction, but at a temperature $T_{initial}$ (for example at room temperature) and a similar approach can be applied for the calculation of the dimensions of the holder at $T_{final}$, except that consideration is given to the shape and dimensions of the holder and the linear thermal expansion coefficient of the holder material.

Preferably, the gap widths between the plate and the holder are selected so that the plate can freely expand inside the holder up to a temperature of at least 450° C., preferably at least 500° C., even more preferably up to at least 650° C.

Preferably, the recesses and/or protrusions in the plate are distributed equidistantly from one another.

Preferably, the holder is annular or has an annular part for accommodating the plate.

According to another preferred embodiment of the present invention, the plate can be a disc-shaped target that has guides, which are arranged in a star pattern, each pair of guides having a shared axis that is located in the target center, and which guides protrude into corresponding grooves of the holder that are arranged in a star pattern; for example the holder is a part of a cooling plate device. The target is therefore, centered on the cooling plate in a temperature-independent fashion by the target cooling plate design according to the invention. Consequently in the case of the use of an anode ring around the target, it is possible for the gap between the target and anode ring to remain concentric and for it to be kept concentric according to the invention.

It is thus possible to avoid short circuits, which can occur due to an unintended contact between the target, which is operated as a cathode, and the anode ring.

Also as a result of this, the contact surface between the target and the target holder in the cooling plate device (e.g. between the target and a target holder ring) remains concentric and when foil cooling plates are used, uniform stresses are produced in the target. It is thus possible to minimize the contact area.

Figure 5:
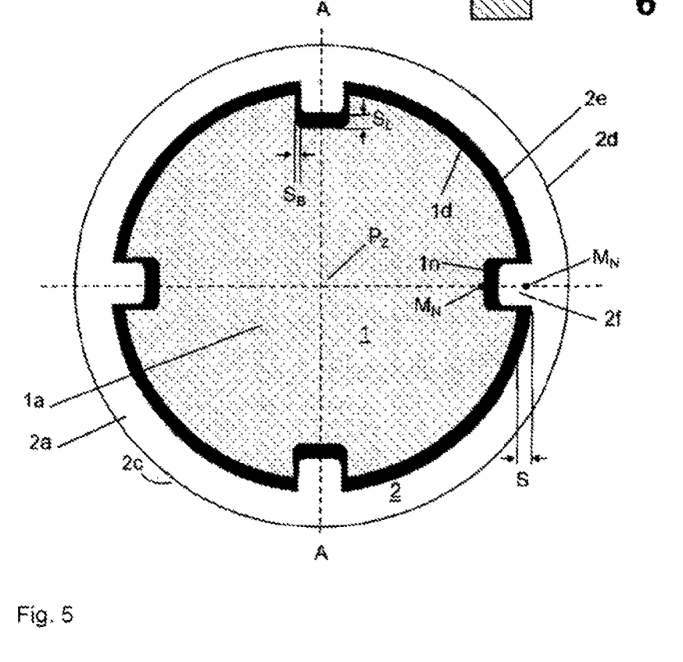
FIG. 5 shows a target holding ring having inward-projecting protrusions that engage in recesses of the target.

In lieu of providing recesses in the cooling plate into which lugs from the target protrude, it is also possible to provide recesses in the target and to embody the receiving body of the cooling plate device, for example the target holding ring, with inward-projecting protrusions that engage in the recesses of the target, as shown in FIG. 5.

Figure 6:
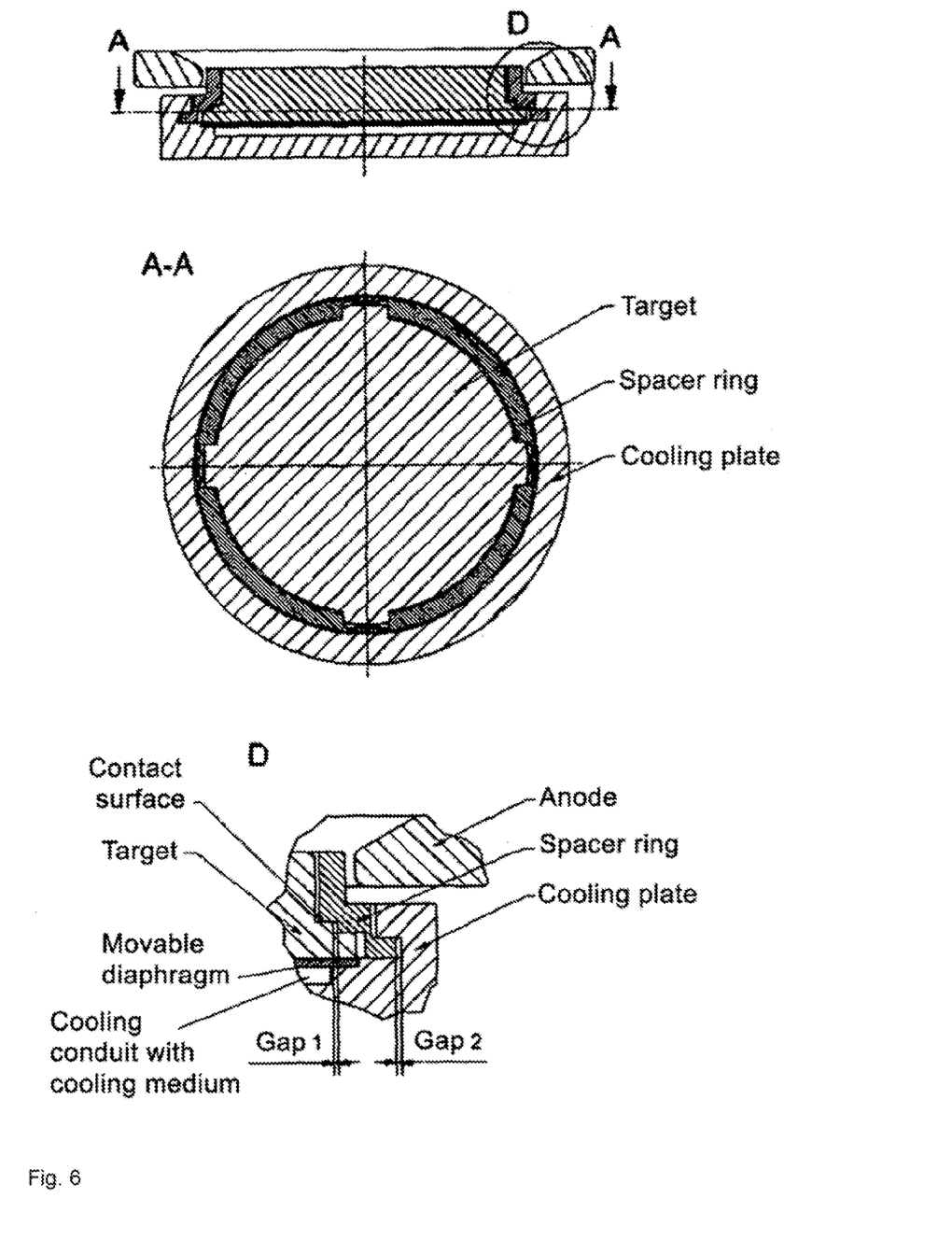
FIG. 6 shows a target mounted in a spacer ring and the ring mounted to a cooling plate, with increased overall play between the target and the cooling plate.

A particular advantage is achieved, by the use of the present invention in existing cooling plates in which an excessively small gap between the target and the cooling plate can be enlarged through the use of a spacer ring. If the target is mounted in a. spacer ring and this ring is then mounted to the cooling plate, it is then possible to increase the overall play (play 1 and play 2) between the target and the cooling plate and thus also to increase the amount of power used, as shown, in FIG. 6.

According to a preferred embodiment of the present invention, the plate-centering system according the invention is a. target-centering system in which the plate 1. is a target 1, the holder 2 is a target holder, and the frame-shaped plate mount 2 is a frame-shaped target mount 2 for accommodating the target 1.

Preferably, the target according to the present invention has a top 1a, a bottom 1c, and an outside 1d; the top or front of the target defines a first surface, the bottom or back of the target defines a second surface, and the outside or outer edge surface of the target defines a third surface, which extends from the top to the bottom.

The frame-shaped target mount 2 has an inside 2e, which is provided with guide protrusions 2f and/or grooves 2a; the guide protrusions 2f extend inward beyond the inside 2e and/or the grooves 2n extend outward beyond the inside 2e.

The edge surface of the target 1d is correspondingly provided with guide protrusions 1f and/or grooves 1n, preferably in the surface region 1d closer to the bottom 1c, with the guide protrusions 1f extending outward beyond the edge surface 1d, preferably essentially parallel to the second surface 1c and/or the grooves 1n extend inward beyond the edge surface 1d, preferably essentially parallel to the second surface 1c.

In order to hold the target, at least three guide protrusions and/or grooves spaced apart from one another are provided in the target and in the target mount so that the guide protrusions of the target and/or the target mount are held in the corresponding grooves of the target mount and/or target when the target is attached to the target mount.

The guide protrusions and/or grooves are made so that in each "guide protrusion/groove" pair, the width and length of the groove are greater than the width and length of the corresponding guide protrusion.

Preferably, all of the grooves have the same shape and the same dimensions and all of the guide protrusions have the same shape and the same dimensions.

The "guide protrusion/groove" pairs are distributed so that in each "guide protrusion/groove" pair, the position of the center of the width of the groove coincides with the position of the center of the width of the corresponding guide protrusion and this position is selected so that at room temperature., it is situated in an axial direction from the target center, which remains unchanged in the same axial direction from the target center after a thermal expansion of the target and/or the target mount at higher temperatures.

The target can be embodied in any shape, for example it can be a round, rectangular, square, triangular, or oval sputtering target.

Preferably, the frame-shaped target, mount is made of a special, tough, temperature-stable steel that accommodates the target for example the sputtering target, so that the latter is supported in a floating fashion, Mass tolerances between the frame-shaped target mount and the sputtering target permit an expansion when the temperature increases, without producing mechanical stress.

According to a preferred embodiment of the invention, the target is disc-shaped.

According to a preferred embodiment of the invention, live frame-shaped target mount is a supporting ring.

A supporting ring according to the present invention has a top 2a, a bottom 2c, an inside 2e, and an outside 2d; the supporting ring 2 serves to mechanically attach the target to a sputtering source body 10 and in this case, the inside 2e of the holder ring at least partially encompasses the outside 1d of the target.

The inside of the holder ring has a plurality of at least three guide grooves or guide pins that perform a centering function.

Correspondingly, the outside of the target has radial "guide tabs" or "guide grooves" so that the guide of the target is always centered inside the supporting ring.

The plurality of inverse recesses and/or extensions of the inside of the holder ring, which fit the guide pins and/or guide grooves on/in the outside of the target, centers the target inside the holder ring and the play between the outside of the target and the inside of the holder ring is selected so that length and width changes can occur in all directions.

Preferably, the target is first mounted in the holder ring so that the corresponding "guide pin/recess" and/or "guide groove/extension" pairs are secured and if necessary, a fastening clamp is used to mechanically affix the target to the holder ring. A lock washer can, for example, be particularly well suited for use as a fastening clamp in this context.

A holder ring in the context of the present invention is also considered to be a "spacer ring" and is therefore also referred to as a spacer ring because it is positioned between the target and the sputtering source body.

Preferably, the sputtering source body has a cooling device for cooling the target, embodied in the form of a closed cooling plate with a movable diaphragm so that a very good cooling action and a good thermal conduction are achieved by means of the movable diaphragm that is pressed against the back of the target.

If the sputtering source body has a cooling plate device with a movable diaphragm, then it is particularly advantageous for the spacer ring to be made of a very tough, temperature-stable, nonmagnetic steel. This prevents bending of the spacer ring and therefore of the target that can occur due to the hydrostatic pressure that uniformly presses the movable diaphragm against the back of the target.

For example, the holder ring is forged from a temperature-stable steel such as 1.3974 steel and solution annealed at 1020° C. for 1 hour.

The holder ring preferably has bayonet elements on its outside, thus making it easier for a target according to the present invention that is already accommodated in the holder ring to be installed in or removed from the sputtering source body.

In order to improve the thermal conduction and thus to reduce the thermal load and increase the power density in a sputtering target, a carbon film, as mentioned in WO2013149692A1, is preferably glued to the back of the target.

Using a target-holding mount/sputtering source body system according to the present invention, it is possible to operate targets with both low sputtering power densities, for example in the range of >0 W/cm$^2$ to <50 W/cm$^2$, and very high sputtering power densities, for example from 50 W/cm$^2$ to 100 W/cm$^2$.

According to the present invention, the spacing tolerance between the outside of the target and inside of the holder ring must be selected so that the percentage expansion of the different materials 1 and 2 is calculated with different expansion coefficients $\alpha 1$ and $\alpha 1$. For example, for a combination of a target made of a typical coating material such as Al or Ti and a holder ring made of 1.3974 steel, as described above, one could select a spacing tolerance of 0.5 to 1.5% of the relevant dimension, more preferably between 0.75 and 1.25%.

In other words, according to the present invention, for such, a system and for a diameter of the target, of 150 mm, one could select a radial spacing tolerance S/2 of 0.5 mm, i.e. a total spacing tolerance S of 1 mm in diameter, which corresponds to approx. 0.7%. Preferably, the radial spacing tolerance S/2 in this connection is between 0.1 mm and 5 mm, more preferably S/2 is between 0.3 mm and 1 mm, and particularly preferably, S/2 is approximately 0.5 mm.

If the target is provided with guide protrusions according to the invention, then the guide protrusions are preferably made of the same material as the target.

If the holder ring is provided with guide protrusions according to the invention, then the guide protrusions are preferably made of the same material as the holder ring.

According to a preferred variant of the invention, the front surface of the target is not flat.

According to another preferred variant of the present invention, the front surface of the target is larger than the back surface of the target.

What, has been disclosed is a coating source as a material supply for a PVD coating including a) a plate supported in a holder, having a plate front, a plate back, and a centering means; the plate front is provided for converting coating material from the surface into the gas phase during the PVD process and the centering means is embodied so that the centering is assured at different plate temperatures b) a cooling device, which is provided on the back of the plate and is equipped with a closed cooling plate that is embodied in the form of a movable diaphragm; in order to ensure a good thermal contact between the back of the plate and the diaphragm, a self-adhesive graphite film is glued to the back of the plate where the elements of a bayonet fitting are provided on the holder and the cooling device so that the holder with the centered plate can be affixed to the cooling device by means of the bayonet fitting.

In the coating source, the material of the plate can have a first thermal expansion coefficient $\alpha 1$ and the material of the holder can have a second, thermal expansion coefficient $\alpha 2$, where: $\alpha 1 > \alpha 2$.

In the coating source, in the edge region of the back of the plate, the holder can include an abutting piece for the flat support of the plate and above the front of the plate, the holder can include a flute so that after the plate is inserted into the holder, the latter can be affixed there by means of a snap ring, which snaps into the flute.

In the coating source, the holder can be made of a tough, temperature-stable, nonmagnetic steel, preferably 1.3974 steel, which is forged and solution annealed at 1020° C. for one hour.

The coating source can be provided, with means for connecting to a voltage source, which make it possible to apply a negative potential to the target relative to an electrode so that the target can be used as a cathode and the electrode can be used as an anode, The anode can be placed around the target and can be embodied in the form of an anode ring.

A PVD system with at least one coating source as described above has also been disclosed.

The invention claimed is:

1. A coating source as a material supply for a PVD coating, comprising:
  a) a plate supported in a holder, the plate having a plate front, a plate back, and a centering device; the holder having a frame-shaped target mount for accommodating the plate while the plate is a target; the plate front is provided for converting coating material from a surface into a gas phase during a PVD process and the centering device assures centering of the plate at different plate temperatures; and
  b) a cooling device, which is provided on a back of the plate and is equipped with a cooling conduit and a closed cooling plate that is embodied in the form of a movable diaphragm; in order to ensure a thermal contact between the back of the plate and the diaphragm, a self-adhesive graphite film is glued to the back of the plate, wherein elements of a bayonet fitting are provided on the holder and the cooling device so that the holder with the centered plate can be affixed to the cooling device by the bayonet fitting, and wherein in order to hold the target at least three guide protrusions and/or grooves spaced apart from another are provided in the target and the target mount so that the guide protrusions of the target and/or the target mount are held in the corresponding grooves of the target mount and/or the target when the target is attached to the target mount; and the sets of guide protrusions and grooves are distributed so that in each guide protrusion and groove set a position of a center of a width of the groove coincides with a position of a center of a width of a corresponding guide protrusion and this position is selected so that at room temperature the position is situated in an axial direction from the target center, which remains unchanged in the same axial direction from the target center after a thermal expansion of the target and/or the target mount at an increased temperature; and wherein a material of the plate has a first thermal expansion coefficient $\alpha 1$ and a material of the holder has a second thermal expansion coefficient $\alpha 2$, where: $\alpha 1 > \alpha 2$.

2. The coating source according to claim 1, wherein in an edge region of the hack of the plate, the holder has a supporting surface for flat support of the plate and above the plate front, the holder has a flute so that after the plate is inserted into the holder, the latter can be affixed there by a snap ring, which snaps into the flute.

3. The coating source according to claim 1, wherein the holder consists essentially of a temperature-stable, nonmagnetic steel, which is forged and solution annealed at 1020° C. for one hour.

4. The coating source according to claim 1, wherein the coating source can be connected to a voltage source, which make it possible to apply a negative potential to a target relative to an electrode so that the target can be used as a cathode and the electrode can be used as an anode.

5. The coating source according to claim 4, wherein the anode is placed around the target and is an anode ring.

6. A PVD system with at least one coating source according to claim 1.

* * * * *

UNITED STATES PATENT AND TRADEMARK OFFICE
CERTIFICATE OF CORRECTION

PATENT NO. : 9,536,714 B2  
APPLICATION NO. : 14/783168  
DATED : January 3, 2017  
INVENTOR(S) : Krassnitzer et al.

Page 1 of 1

It is certified that error appears in the above-identified patent and that said Letters Patent is hereby corrected as shown below:

Column 10 Claim 2, Line 2, replace "hack" with --back--.

Signed and Sealed this
Seventh Day of November, 2017

Joseph Matal
*Performing the Functions and Duties of the
Under Secretary of Commerce for Intellectual Property and
Director of the United States Patent and Trademark Office*